United States Patent [19]

Chung

[11] Patent Number: 5,059,582

[45] Date of Patent: Oct. 22, 1991

[54] SUPERCONDUCTOR-METAL LAMINATES AND METHOD OF MAKING

[75] Inventor: Deborah D. L. Chung, Pittsburgh, Pa.

[73] Assignee: The Research Foundation of State University of NY, Albany, N.Y.

[21] Appl. No.: 326,918

[22] Filed: Mar. 22, 1989

[51] Int. Cl.$^5$ .............................................. B32B 9/00
[52] U.S. Cl. ...................................... 505/1; 505/701; 505/702; 505/703; 505/704; 428/323; 428/408; 428/457; 428/688; 428/930
[58] Field of Search ........................... 505/1, 701–704; 428/688, 930, 457, 408, 323; 29/599

[56] References Cited

U.S. PATENT DOCUMENTS 3,985,281 10/1976 Diepers et al. ......................... 427/62
4,195,199 3/1980 Hillmann et al. ...................... 29/599
4,336,420 6/1982 Benz ...................................... 29/599

OTHER PUBLICATIONS

IEEE Transaction on Magnetics, vol. May 17, 1981, Spenor et al., pp. 1006–1009.
E. I. Monthly, Carbon Fiber Reinforced Zin-SC composites, Journ Matls Research, vol. 4, No. 6, 11/12/89, pp. 1339–1346.

*Primary Examiner*—Patrick J. Ryan
*Attorney, Agent, or Firm*—Michael L. Dunn; James F. Mudd; Ellen K. Park

[57] ABSTRACT

A superconducting laminate having at least one layer of metal and at least one layer of superconducting material. The metal layer and the superconducting layer are bonded. The metal later may also include carbon fibers from various precursors. The superconductor may be a composite material. The invention also includes a method of making the laminates.

48 Claims, 16 Drawing Sheets

SUPERCONDUCTOR-METAL LAMINATES AND METHOD OF MAKING

BACKGROUND OF THE INVENTION

The present invention relates to superconductor-metal laminates and to a method of making such laminates.

The high $T_c$ (superconducting transition temperature) superconductors are generally brittle, hard to shape, and high in electrical resistivity at normal temperatures. By high $T_c$ superconductors are meant superconductors with $T_c$ above the temperature of liquid nitrogen (77° K.). Typically, metals are not high $T_c$ superconductors and at normal temperatures are ductile, formable, low in electrical resistivity and high in thermal conductivity.

It has been recognized that the combination of a high $T_c$ superconductor and a metal in the form of a composite material is attractive for the following reasons: the combination has improved toughness, ductility, shapeability and formability; improved electrical and thermal stabilization; and improved critical current density. The critical current density is the current density above which the superconductor loses its superconductivity, at a given temperature below $T_c$.

Powder metallurgy has been used to fabricate superconductor-metal composites. (In-Gann Chen, S. Sen and D. M. Stefanescu, Appl. Phys. Lett. 52 (16), 1355 (1988); F. H. Streitz, M. Z. Cieplak, Gang Xiao, A. Gavrin, A. Bakhshai and C. L. Chien, Appl. Phys. Lett. 52, 927 (1988); A. Goyal, P. D. Funkenbusch, G. C. S. Chang and S. J. Burns, Mater. Lett. 6 (8–9), 257 (1988)). Generally powder metallurgy involves mixing superconductor powder and metal powder, followed by sintering the mixture. There are some problems with this method. For example, the metal content is limited to 50 vol. % or below in order to have a continuous superconducting path in the composite. This limits the ductility of the composite. In addition, the choice of metal is limited to metals that are stable at the sintering temperature in oxygen and do not react with the superconductor at the sintering temperature (typically 950° C. for $YBa_2Cu_3O_{7-\delta}$).

Another method that has been used in forming a superconductor-metal composite involves (i) packing a superconductor powder in a metal tube, (ii) drawing the tube to a smaller diameter, and (iii) sintering. This method is commonly known as the metal tube drawing method. (R. W. McCallum, J. D. Verhoeven, M. A. Noack, E. D. Gibson, F. C. Laabs and D. K. Finnemore, Advanced Ceramic Materials 2 (3B), 388 (1987); S. Jin, R. C. Sherwood, R. B. Van Dover, T. H. Tiefel and D. W. Johnson, Jr., Appl. Phys. Lett. 51, 203 (1987)). Similar drawbacks as with the powder metallurgy method have been recognized with this method. For example, the choice of metal is limited to metals that are stable at the high sintering temperature required by the superconductor.

A further disadvantage of the superconductor-metal composites formed by the above described methods is that they are generally weak in tension.

It is therefore an object of this invention to provide a method for fabricating superconductor-metal materials which overcome the problems recognized in the art.

It is a further object to provide a method of producing a superconductor-metal material which overcomes the limitations of known methods while retaining the desirable characteristics.

A still further object is to produce a superconductor-metal material having both good tensile and compressive strength.

SUMMARY OF THE INVENTION

The invention is a superconducting laminate comprising, first and second layers; said first layer comprising a ceramic superconductor and said second layer comprising a metal; said first layer being diffusion bonded to said second layer.

The invention further comprises a superconducting laminate comprising first and second layers; said first layer comprising a ceramic superconductor and said second layer comprising a metal and carbon fibers; said first layer being bonded to said second layer.

The invention also comprises a method for preparing a superconducting laminate comprising the steps of, a) preparing a superconducting layer; b) preparing a metal layer; and c) diffusion bonding said superconducting layer with said metal layer.

The invention includes a method for preparing a superconducting laminate comprising the steps of, a) preparing a superconducting layer; b) preparing a metal-carbon fiber layer; and c) bonding said superconducting layer with said metal-carbon fiber layer.

DETAILED DESCRIPTION OF THE INVENTION

Figure 1:
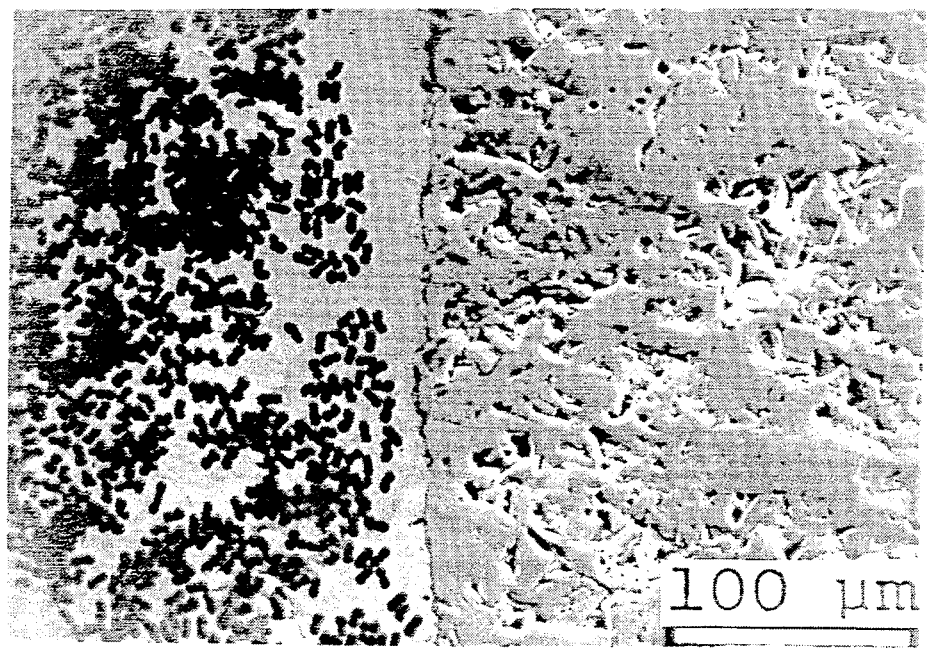
FIG. 1 Is an SEM (Scanning Electron Microscope) photograph of a portion of a polished section of an MMC-$YBa_2Cu_3O_{7-\delta}$-MMC (MMC is the metal-matrix carbon fiber composite) three-layer laminate containing 32.1 vol. % fiber and 50.2 vol. % Sn (Tin). The left half is the MMC, the right half is the superconductor. The small dumbbell shaped spots in the MMC are the tips of carbon fibers.

By superconducting laminate is meant an article having at least 2 layers, at least one of which comprises a high $T_c$ superconductor and at least one of which comprises a metal.

A metal as used herein means any metal which will be able to diffuse into the surface of the superconducting layer at a temperature lower than the degradation temperature of the superconducting material, and includes alloys. Examples of suitable metals include, but are not limited to tin, indium, and tin-lead alloy. A preferred metal is tin (Sn). The metal may be in a form suitable for forming the laminates of the present invention and includes foils, ingots, sheets, and powders. The thickness of the metal layer may vary in accordance with the invention, preferably, the thickness of the metal where no carbon fibers are incorporated is between about 0.1 mm to about 6 mm. The thickness of the metal layer where carbon fibers are incorporated is between about 0.4 mm to about 6 mm.

In accordance with this invention, the laminates may comprise between about 1 to about 99 vol. % metal (total volume being the volume of metal and the volume of superconductor). Preferred laminates comprise between about 40 to about 80 vol. % metal. Most preferred laminates comprise about 80 vol. % metal. Although the preferred and most preferred laminates are discussed above, the actual vol. % of the metal utilized will also depend on the thickness of the superconductor layer.

Superconductor as used herein is any ceramic superconductor and may include superconductor composites. Examples of superconductors are $YBa_2Cu_3O_{7-\delta}$, $Bi_2Sr_{3-x}Ca_xCu_2O_{8+y}$, and $Tl_2Ba_2CaCu_2O_8$. A preferred superconductor is $YBa_2Cu_3O_{7-\delta}$. The superconductor can be in bulk, wire or film form as prepared by any known technique. For example, for the superconductor $YBa_2Cu_3O_{7-\delta}$, the $YBa_2Cu_3O_{7-\delta}$ powder (commercially available from a variety of sources known to those skilled in the art) was pressed at a pressure of 137 MPa (mega pascal) and then sintered at 950° C. for 12 h, followed by annealing at 420° C. in flowing oxygen for 1 h. Superconductor composites include composites which comprise superconductor and metal and includes those which may be formed by the powder metallurgy method, the metal tube drawing method or other known methods. Generally, laminates having a superconducting layer in the order of at least 1000 angstroms in thickness are preferred.

The laminates of the present invention have a continuous superconducting path and the superconducting layer retains it's high $T_c$ superconducting property after incorporation into the laminate.

While various lamination methods may be used, the laminates are preferably formed by diffusion bonding, e.g. by hot pressing the superconducting material and the metal, in air at a temperature lower than the melting point of the metal (which melting point, in accordance with this invention, is lower than the degradation temperature of the superconductor). Diffusion bonding as used herein means the solid state bonding of two materials by using heat and pressure. The degradation temperature of the superconducting material means the temperature above which the material no longer is a high $T_c$ superconductor. For example, for the superconductor $YBa_2Cu_3O_{7-\delta}$, the degradation temperature is about 300° C., and hot pressing would be conducted at a temperature lower than 300° C.

Hot pressing is for a sufficient time and at a sufficient pressure for diffusion bonding to occur. For a given metal, the temperature, pressure and time may be adjusted so that various combinations of temperature, pressure and time may be utilized to achieve the diffusion bond. As is well known in the art, typically, if a higher temperature is used, a lower pressure and shorter time may be sufficient. The pressure utilized, however, is limited by the compressive strength of the superconductor.

In another embodiment of the invention, a laminate having three layers may be prepared. The superconductor may have a metal layer on either side of the superconductor to package the superconductor. This laminate may be prepared as described above by hot pressing a layer of superconductor sandwiched by two layers of metal, one on either side of the superconductor at a temperature below the melting point of the metal at a sufficient pressure and for a sufficient time in order to achieve diffusion bonding.

It is within the scope of this embodiment that the two metal layers on either side of the superconductor layer may comprise the same or different metals. More particularly, both layers may be tin or one metal layer may be tin and the other metal layer may be a tin-lead alloy or indium or any other combination, which would meet the above discussed parameters.

It is also within the scope of this invention to have a plurality of ceramic superconductor layers alternating with metal layers.

In another embodiment of the invention, a reinforced laminate having greater tensile strength was made by the addition of carbon fibers to the metal layer. The carbon fiber reinforced metal provides an effective way of packaging ceramic superconductors so that the package exhibits good mechanical, electrical and thermal properties. The carbon fibers may include those made from a variety of precursors such as textile fibers, pitch or other precursors. An example of a textile fiber is PAN (polyacrylonitrile).

The fibers may be in a continuous or short form. If the continuous form is used, they may be unidirectional, multidirectional or in the form of a woven fabric. In a preferred embodiment, continuous, unidirectional carbon fibers may be utilized. Between about 0 vol. % to about 50 vol. % of carbon fiber (the volume being the volume of metal and carbon fiber) may be incorporated into the metal layer. It is preferred that about 15-40 vol. % of carbon fiber is incorporated into the metal layer.

The carbon fiber reinforced metal-superconductor laminate may be prepared by using a two-step process. The first step is the preparation of a metal-matrix carbon fiber composite (abbreviated MMC) by laying up carbon fibers and metal in the form of alternate layers and consolidating by hot pressing (by using a hydraulic press or other known methods) at a temperature, pressure and time which will allow the metal to penetrate or diffuse into void spaces between the carbon fibers. The second step involves hot pressing a layer of superconductor sandwiched by two layers of MMC at a sufficient temperature, preferably below below the melting point of the metal, and at a sufficient pressure for a sufficient time in order to achieve bonding between the MMC and the superconductor. Bonding means the liquid or solid state joining of two or more materials. Methods of bonding, as used herein, includes adhesive bonding, soldering, brazing, welding and diffusion bonding.

It is to be understood, particularly in the case of carbon fiber containing materials, that lamination or bonding methods other than diffusion bonding may be used. Such methods, however, may have serious disadvantages related to physical limitations of certain materials which may allow degradation or destruction of such materials, as a result of the conditions encountered during lamination.

EXAMPLES

EXAMPLE 1

To make a superconductor-tin laminate (without carbon fibers), in accordance with this invention, the superconductor $YBa_2Cu_3O_{7-\delta}$ was prepared as described above, tin foil (60 vol. %, 4.12 g, 3.36 mm thick, includes both tin layers) was diffusion bonded to both sides of the $YBa_2Cu_3O_{7-\delta}$ superconductor layer (40 vol. %, 1.54 g, 2.24 mm thick) by hot pressing in air at 140° C. and 5.3 MPa for 15 minutes. Table 1 below lists other percentages of tin which were used and the various thicknesses of the tin (includes both layers) and the superconductor.

TABLE 1

| Vol. % Sn | Thickness (mm) | |
|---|---|---|
| | Superconductor | Tin |
| 81.6 | 0.460 | 2.032 |
| 77.8 | 0.580 | 2.032 |
| 73.4 | 0.741 | 2.032 |
| 64.5 | 1.126 | 2.032 |
| 50.1 | 2.036 | 2.032 |
| 36.0 | 1.803 | 1.016 |
| 33.3 | 2.032 | 1.016 |
| 29.4 | 2.448 | 1.016 |
| 26.5 | 2.821 | 1.016 |
| 25.0 | 3.058 | 1.016 |
| 24.0 | 3.213 | 1.016 |
| 22.2 | 3.556 | 1.016 |
| 20.0 | 4.063 | 1.016 |
| 19.5 | 1.676 | 0.406 |
| 15.6 | 1.372 | 0.254 |
| 10.7 | 2.381 | 0.254 |

TABLE 1-continued

| Vol. % Sn | Thickness (mm) | |
|---|---|---|
| | Superconductor | Tin |
| 6.1 | 3.897 | 0.254 |

EXAMPLE 2

To produce a carbon fiber reinforced tin-superconductor laminate in accordance with this invention, the previously described two-step process may be utilized.

In the first step, a tin-matrix unidirectional carbon fiber composite (abbreviated MMC), was prepared by laying up carbon fibers (15 vol. %, 0.285 g; continuous, unidirectional, and PAN-based, which are commercially available) and tin foils (50 vol. %, 3.75 g) in the form of alternate layers and consolidating by hot pressing (by using a hydraulic press) at 244° C. and at a pressure of 64 MPa for 20 min. The thickness of the MMC layer was 4.06 mm. In the second step a layer of superconductor $YBa_2Cu_3O_{7-\delta}$ (35 vol. %. 1.21 g, 2.18 mm thick) sandwiched by two layers of MMC was hot pressed at 180° C. and 5.1 MPa for 15 min in order to achieve diffusion bonding. Note that 170° C. is below the melting point of tin (232° C.).

TEST RESULTS OF THE LAMINATES

In the resulting laminate, tin served as the adhesive and to increase the ductility, the normal-state electrical conductivity and the thermal conductivity. Carbon fibers served to increase the strength and the modulus, both in tension along the fiber direction and in compression perpendicular to the fiber layers, and also served to increase the thermal conductivity and the thermal fatigue resistance, as shown in table 2 below. Volume % as used in Table 2 includes the volume of carbon, metal and superconductor.

TABLE 2

| Thermal fatigue due to cycling between room temperature and liquid nitrogen temperature | | |
|---|---|---|
| Carbon fiber Content (vol. %) | Sn content (vol. %) | No. of cycles for delamination to start* |
| 0 | 43.2 | 63 |
| 3.0 | 39.4 | 86 |
| 8.3 | 40.1 | 102 |
| 12.0 | 43.1 | 116 |
| 15.3 | 48.3 | 123 |
| 20.1 | 50.2 | 127 |

*Each number is the average of three specimens.

Laminates of various fiber contents were subjected to thermal cycling between room temperature and liquid nitrogen temperature (77° K.) by immersion in liquid nitrogen for 20 min, followed by room temperature equilibration for at least 30 min, and repeating. After every cycle, each specimen was observed under an optical microscope to look for delamination (slight cracking) between the superconductor and the MMC. Table 2 shows the number of cycles for the start of delamination for each laminate composition. The higher the carbon fiber content, the greater the number of cycles required for the start of delamination.

The fabrication of the laminates, according to this invention involves relatively low temperatures. The simplicity of this process makes it possible for an operation to be set up for fabricating continuous superconducting cables which are both shielded and toughened by metal and strengthened by carbon fibers.

The toughness was measured by carrying out the Izod Test using a Tinius Olsen plastic impact tester. The toughness was 3.25 in.lb for a laminate containing 18.8 vol. % Sn (no fibers) and was 5.50 in.lb for a laminate containing 25.5 vol. % Sn (no fibers). Hence, the tin greatly enhanced the toughness.

As can be seen from the SEM photograph shown in FIG. 1, no void or crack was observed between the MMC and the superconductor or between the tin and the carbon fibers in the MMC.

Figure 2:
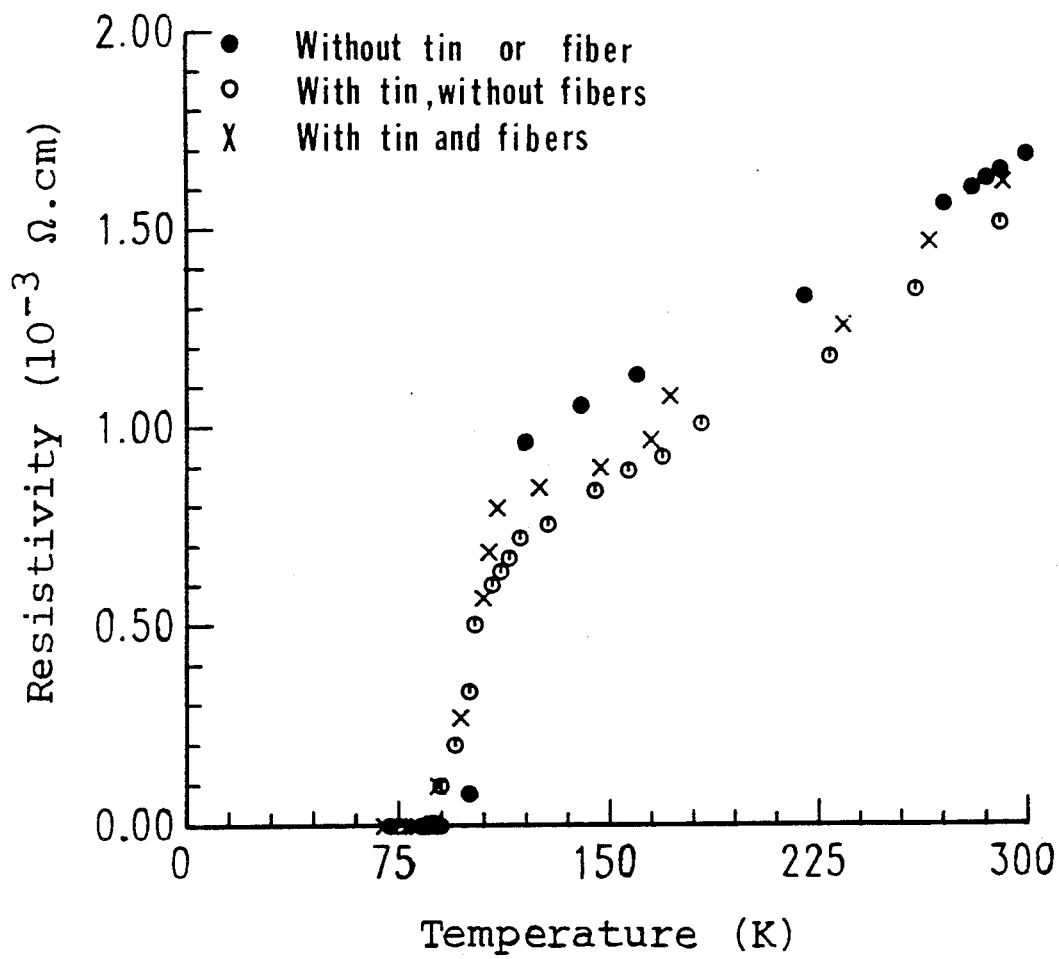
FIG. 2 Shows the dependence of the electrical resistivity on temperature for the plain superconductor (solid circles), for a laminate containing 80.1% vol. % Sn and no fibers (open circles), and for a laminate containing 32.1 vol. % fibers and 50.2 vol. % Sn (crosses).

Electrical resistivity of the laminates can be seen in FIG. 2. The electrical resistivity was measured with the four-probe technique by using a Keithley 181 nanovolt meter and a Keithley 224 programmable current source, such that the current was around $10^{-3}$ amperes. A thermocouple was placed so that it almost touched the sample. In the case of laminates containing fibers, the electrical resistivity was measured in the direction of the fibers however, the electrical resistivity in the direction perpendicular to the fiber axis was comparable to that in the direction parallel to the fibers. The drop to zero resistivity is slightly less sharp for either laminate than the plain superconductor. Carbon fibers have a lower electrical resistivity than the plain superconductor above $T_c$, but its value is higher than that of tin. Therefore, the normal-state electrical resistivity of the laminate with tin and fibers is lower than that of the plain superconductor and higher than that of the laminate with tin and no fiber.

Mechanical testing was performed using a hydraulic Materials Testing Systems (MTS). The strain in tensile or compressive testing was measured by the displacement of the crosshead. The gage length was 34.7 mm for tensile testing and 6 mm for compressive testing. Compressive testing was performed with the force perpendicular to the laminate layers. Tensile testing was performed with the force parallel to the fibers in the plane of the laminate. At least three samples were run and the data were averaged for each composition in each type of test.

Figure 3:
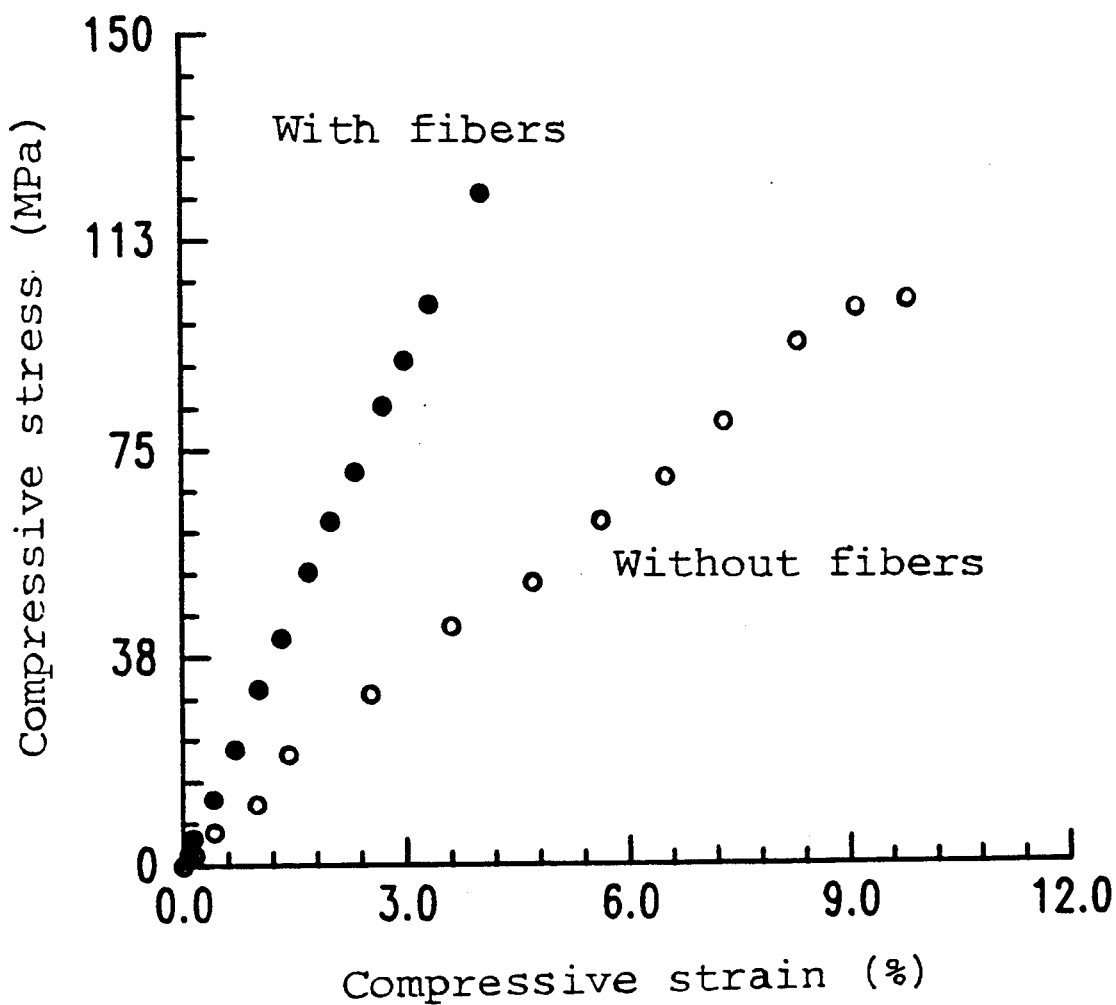
FIG. 3 Shows the compressive stress-strain curves (up to fracture) for a laminate without fibers (24 vol. % Sn) (open circles) and a laminate with fibers (51.1 vol. % Sn and 26.2 vol. % fibers) (solid circles).

FIG. 3 shows the compressive stress-strain curves (up to fracture) for a laminate containing tin (24 vol. % Sn) but no fibers (open circles) and a laminate containing 51.1 vol. % Sn and 26.2 vol. % fibers (solid circles).

Figure 4:
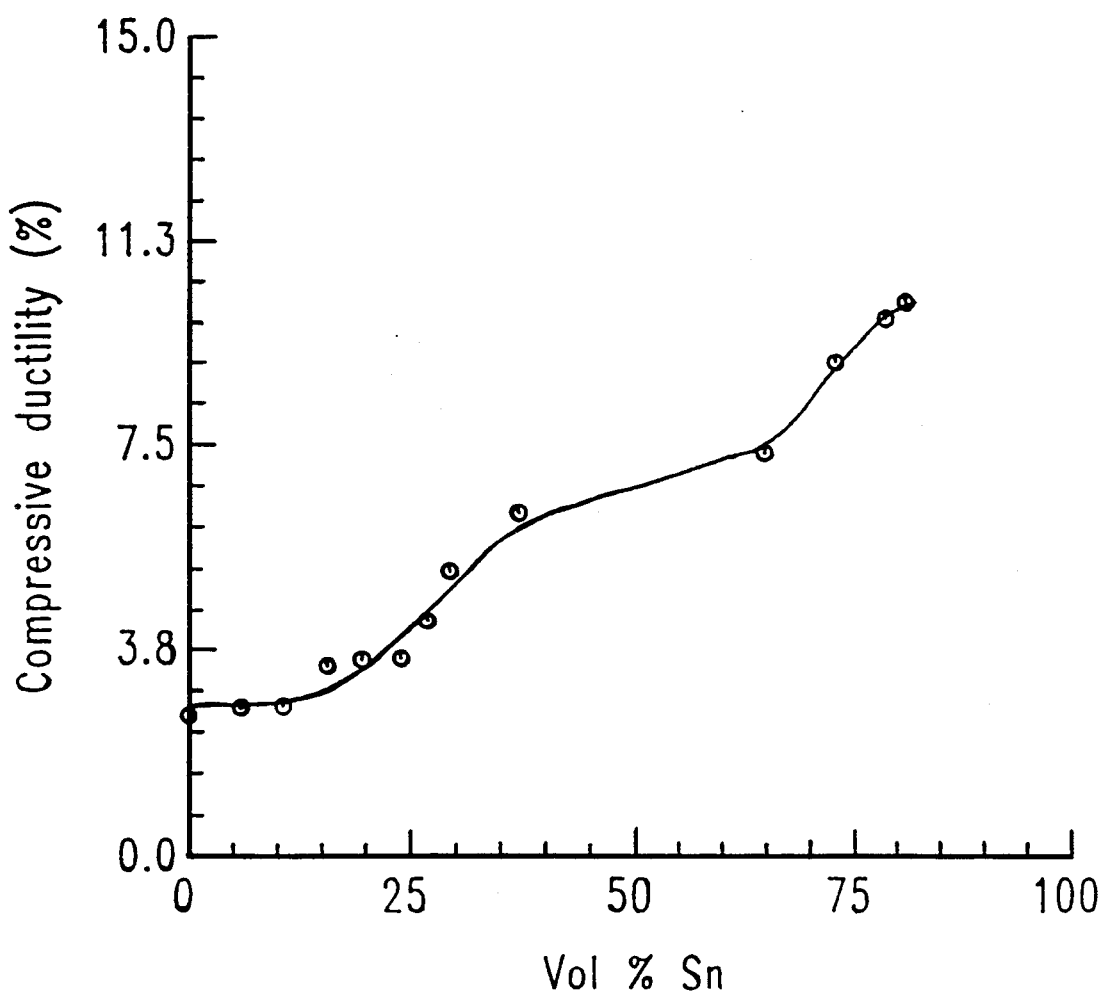
FIG. 4 Illustrates the effect of tin content on the compressive ductility of laminate without carbon fibers; error bar of ±7%.
Figure 5:
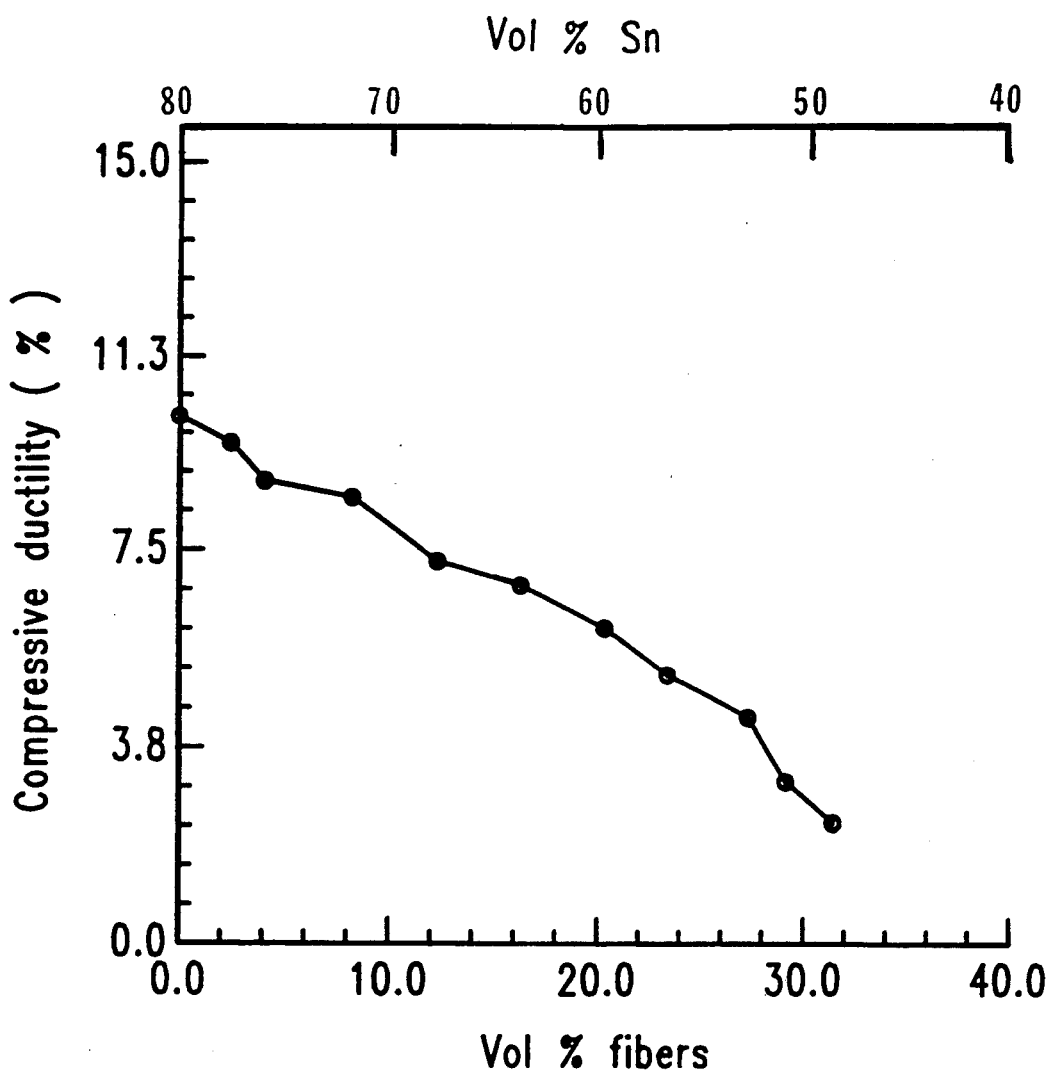
FIG. 5 Shows the effects of tin and fiber contents on the compressive ductility; error bar of ±5%.

FIG. 4 shows that tin greatly increases the ductility of the laminate. FIG. 5 shows that tin greatly increased the ductility of the laminate, but the fibers decreased the ductility.

Figure 6:
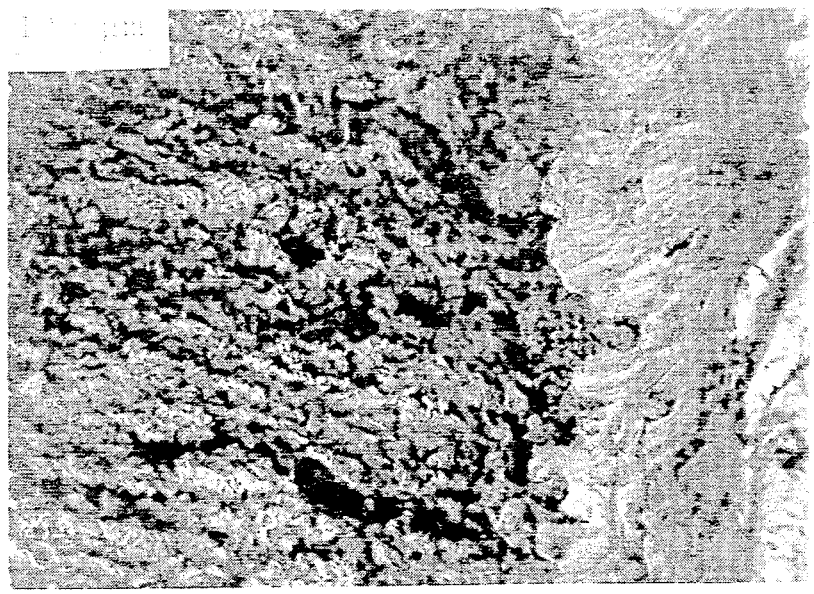
FIG. 6 Is an SEM photograph of the compressive fracture surface of a laminate containing 19.5 vol. % Sn and no fibers. The right one-third of the photograph is tin, the left two-thirds of the photograph is the superconductor.

As can be seen in FIG. 6, cracks are observed to extend from the tin superconductor interface inward into the superconductor. A similar fracture is observed in a laminate with both fibers and tin. In contrast, the plain superconductor (without tin or fiber) shatters and disintegrates into particles upon fracture. Hence, the fracture behavior is dramatically different between either laminate and the plain superconductor.

Figure 7:
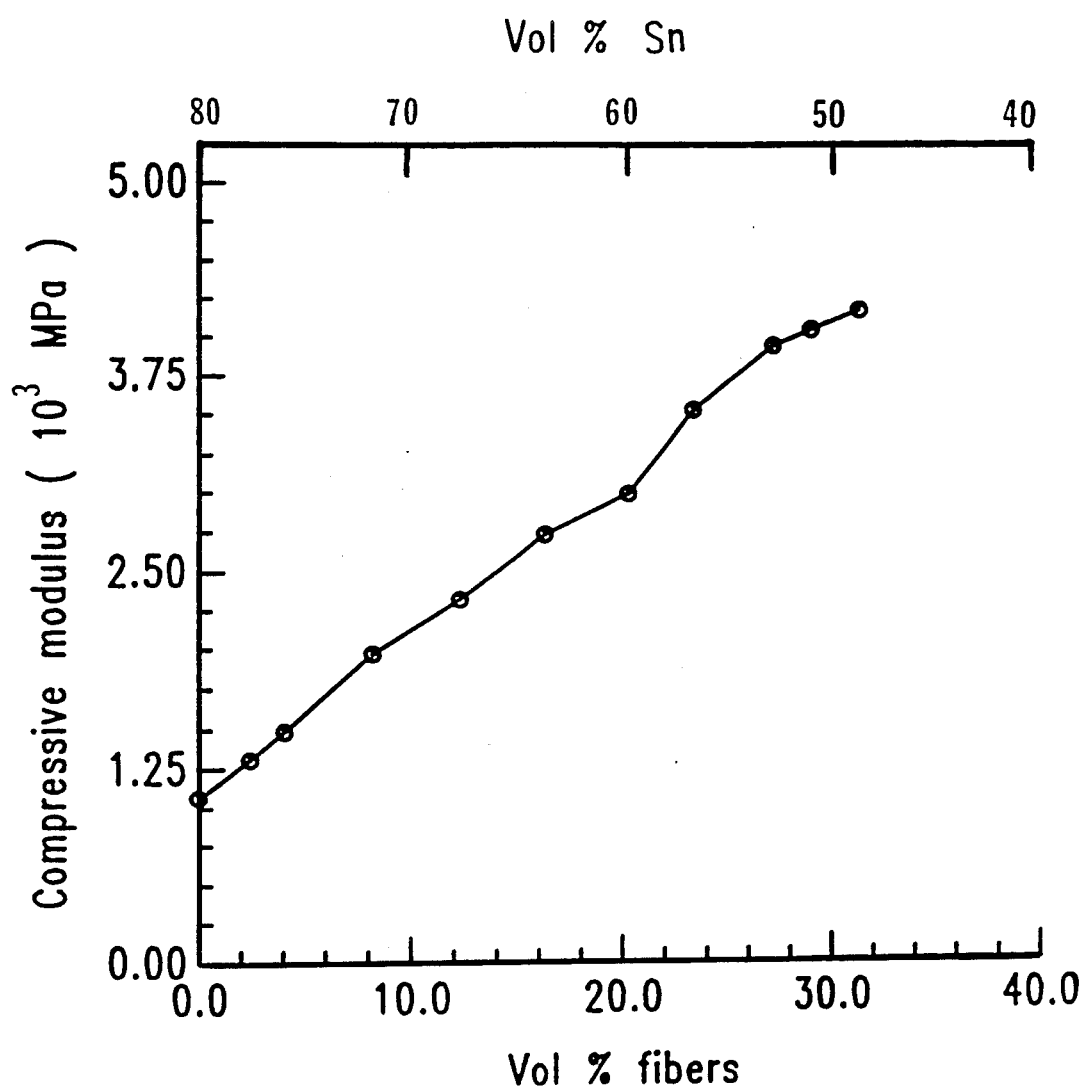
FIG. 7 Shows the effects of tin and fiber contents on the compressive elastic modulus; error bar of ±8%.

The decrease of the modulus with increasing tin content and decreasing fiber content is significant and can be seen in FIG. 7. No systematic trend can be seen in FIG. 8 in the compressive strength, because the strength is very sensitive to small flaws that are bound to be present in the superconductor.

Figure 9:
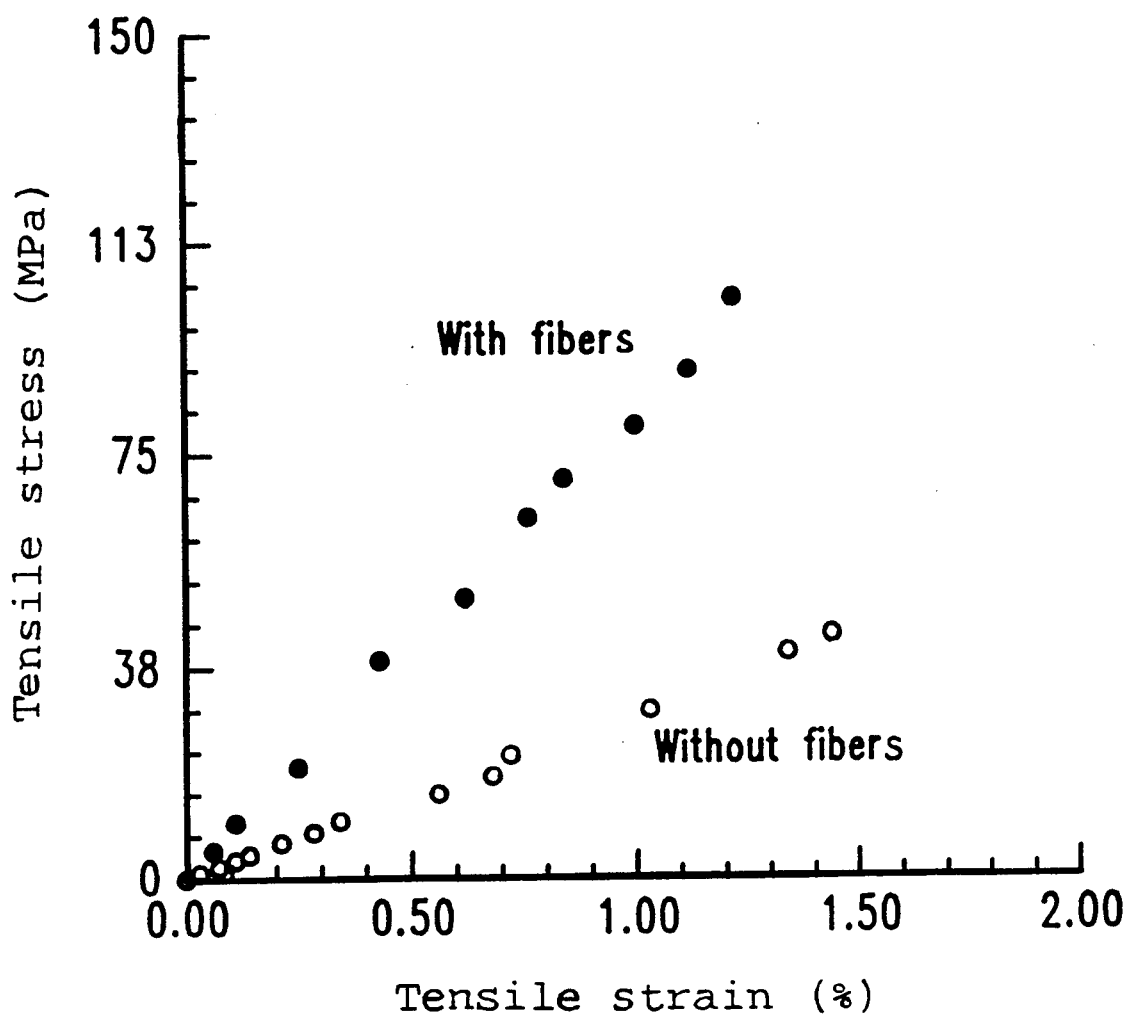
FIG. 9 Shows the tensile stress-strain curves (up to fracture) for a laminate without fibers (24 vol. % Sn) (open circles) and a laminate with fibers (51.4 vol. % Sn and 27.2 vol. % fibers) (solid circles).

FIG. 9 shows the tensile stress-strain curves (up to fracture) for a laminate containing tin (24 vol. % Sn) but no fibers (open circles) and a laminate containing 51.4 vol. % Sn and 27.2 vol. % fibers (solid circles).

Figure 10:
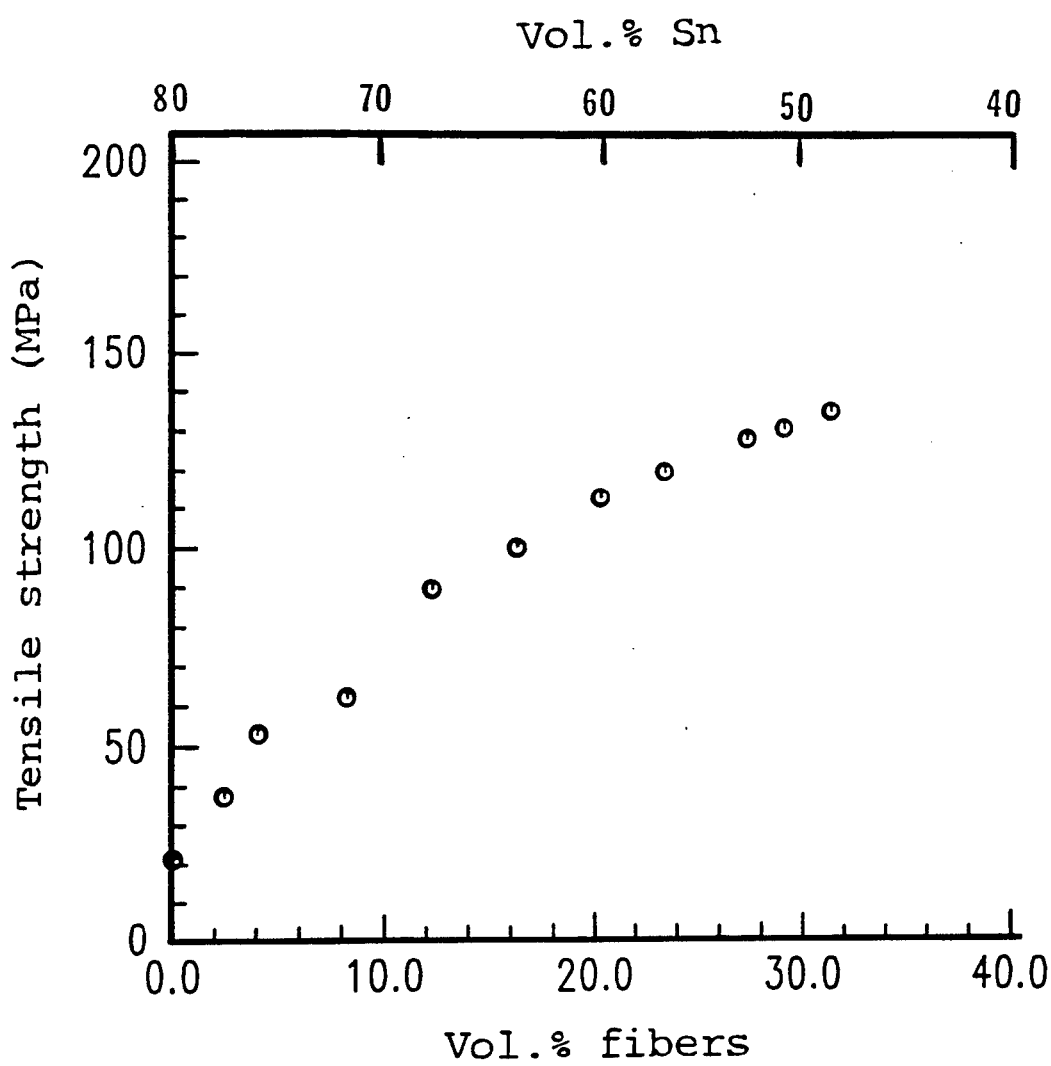
FIG. 10 Illustrates the effects of tin and fiber contents on the tensile strength; error bar of ±8%.
Figure 11:
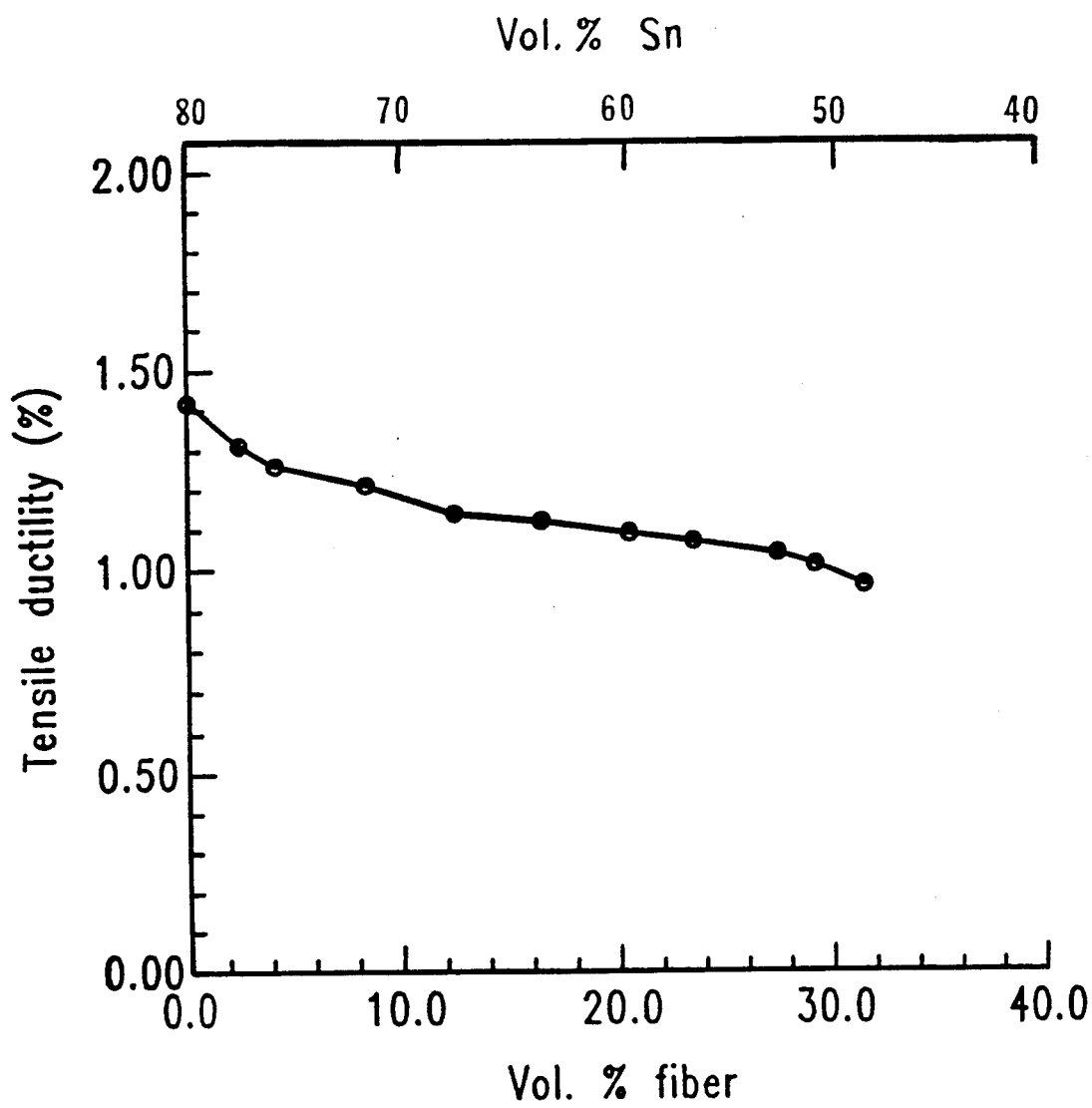
FIG. 11 Illustrates the effects of tin and fiber contents on the tensile ductility; error bar of ±5%.
Figure 12:
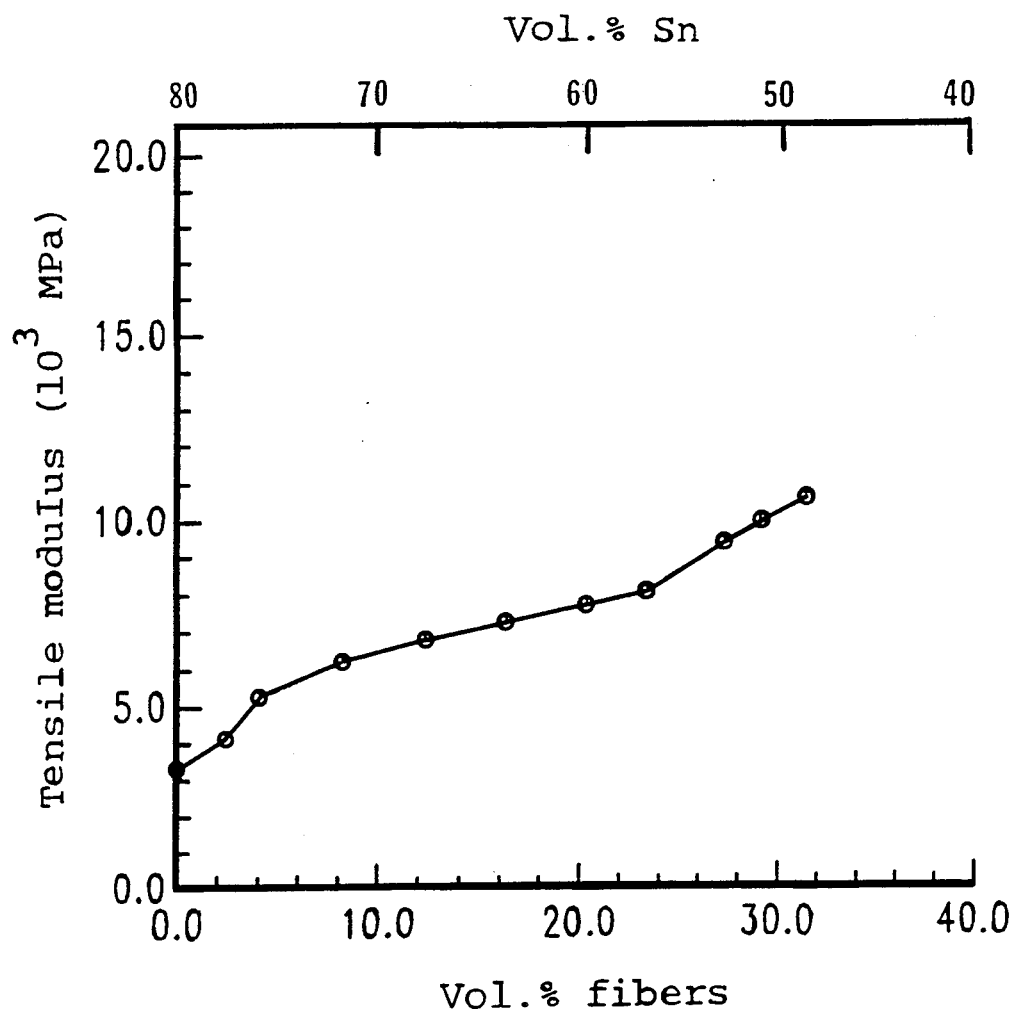
FIG. 12 Shows the effects of tin and fiber contents on the tensile modulus; error bar of ±7%.

FIGS. 10, 11 and 12 show the effects of tin and fiber contents on the tensile test results. The tensile test was performed along the fiber direction. The addition of carbon fibers greatly improved the tensile strength (FIG. 10), but decreased the ductility slightly (FIG. 11). The tensile modulus was increased by increasing the fiber content. Debonding between the MMC and the superconductor and some fiber pull-out were observed from the fracture surface after the tensile test.

Figure 13:
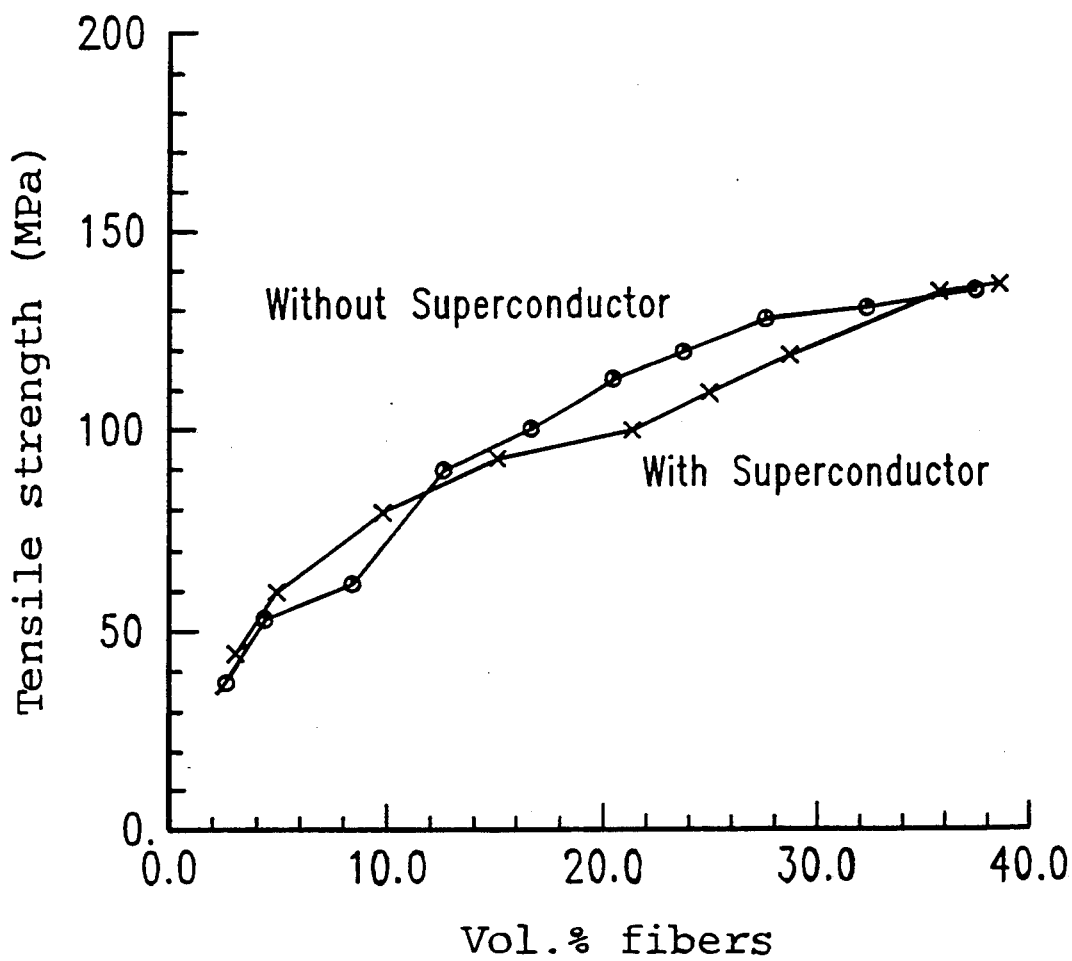
FIG. 13 Shows the dependence of the tensile strength on the carbon fiber content in vol. % fibers, (the volume of the superconductor is not counted in calculating the volume % fibers). Circles: without superconductor (MMC alone), error bar of ±9%; crosses: with superconductor, error bar of ±9%.
Figure 14:
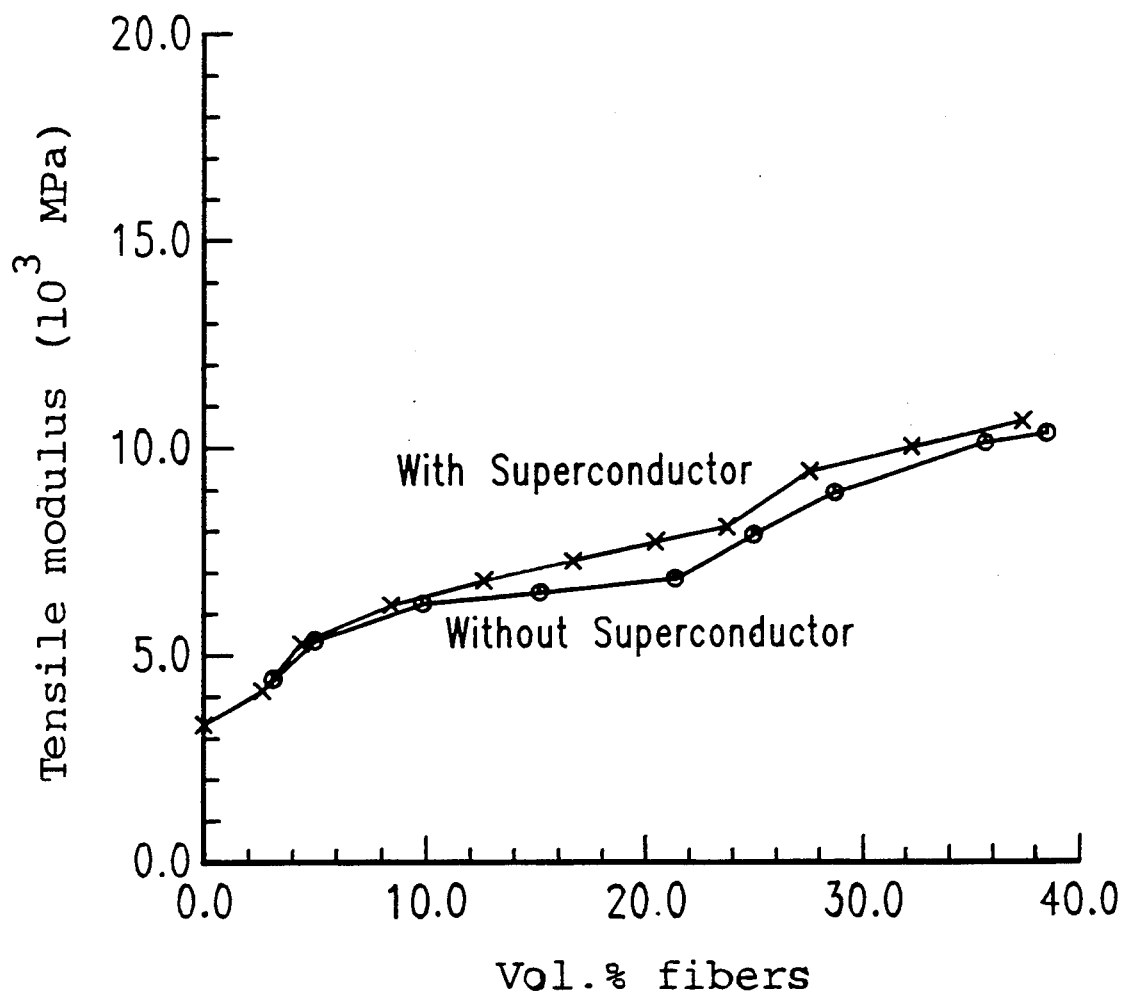
FIG. 14 Depicts the dependence of the tensile modulus on the carbon fiber content in vol. % fibers, (the volume of the superconductor is not counted in calculating the volume % fibers). Circles: without superconductor (MMC alone), error bar of ±8%; crosses: with superconductor, error bar of ±7%.
Figure 15:
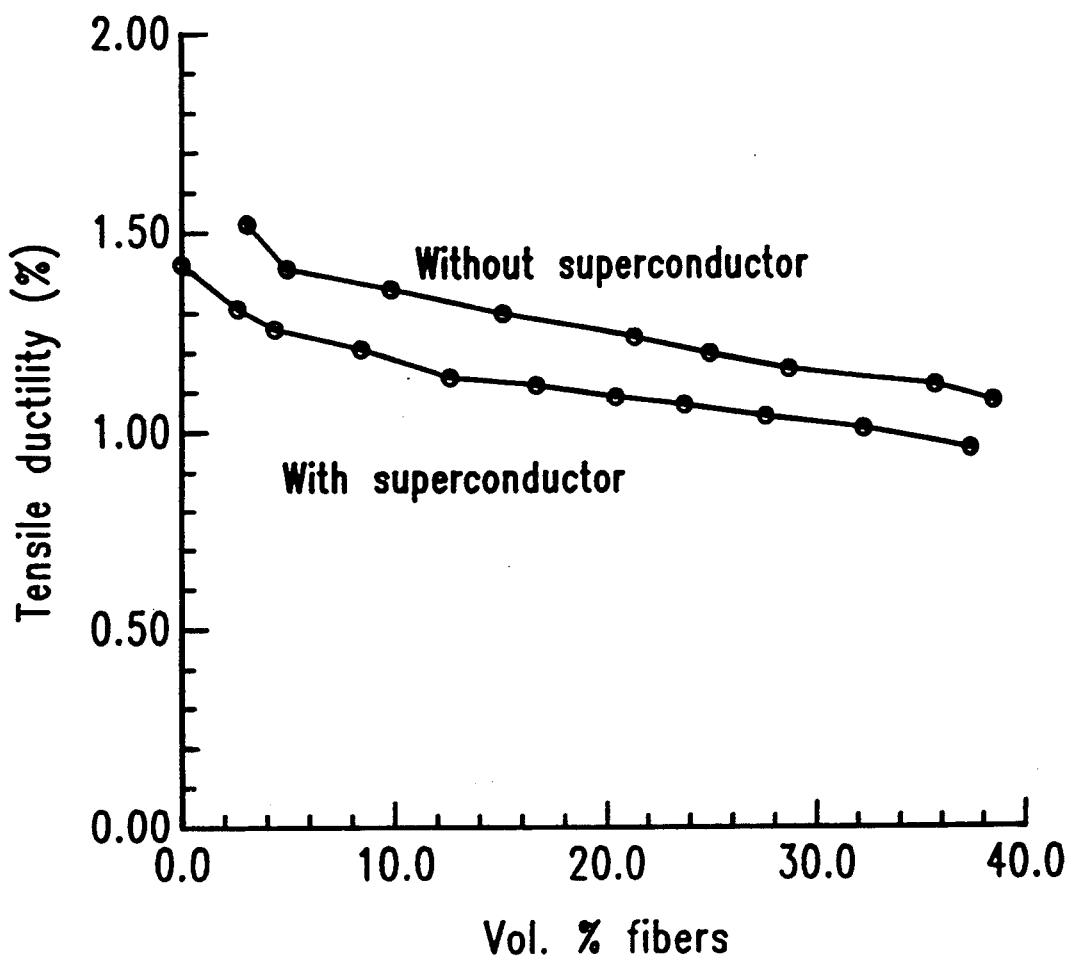
FIG. 15 Shows the dependence of the tensile ductility on the carbon fiber content in vol. % fibers, (the volume of the superconductor is not counted in calculating the volume % fibers). Circles: without superconductor (MMC alone), error bar of ±6%; crosses: with superconductor, error bar of ±5%.

FIGS. 13, 14 and 15 show the effects of the superconductor on the tensile test results. Data obtained with the presence of the superconductor (in the form MMC-superconductor-MMC) are shown by circles. Data obtained with the absence of the superconductor (i.e., MMC alone) are shown by crosses. The horizontal scale of FIGS. 13, 14 and 15 show the vol. % fibers such that the volume of the superconductor was not counted in the volume of the laminate. (Note that this scale is different from the horizontal scale of FIGS. 4, 5, 7, 8, 10, 11 and 12 in which the volume of the superconductor was counted in calculating the volume percent fibers.) The similarity of data with and without the superconductor in FIGS. 13 and 14 shows that the tensile load was almost totally sustained by the MMC. FIG. 15 shows that the tensile ductility is somewhat diminished by the presence of the superconductor.

The tensile test for the plain superconductor (without tin or fibers) did not give very reliable results because of the difficulty of gripping the superconductor, which was difficult in the absence of tin. Nevertheless, the tensile strength was about 5.2 MPa, the tensile modulus was roughly 1.3 GPa (Giga pascal), and the tensile ductility was roughly 0.5%.

Figure 16:
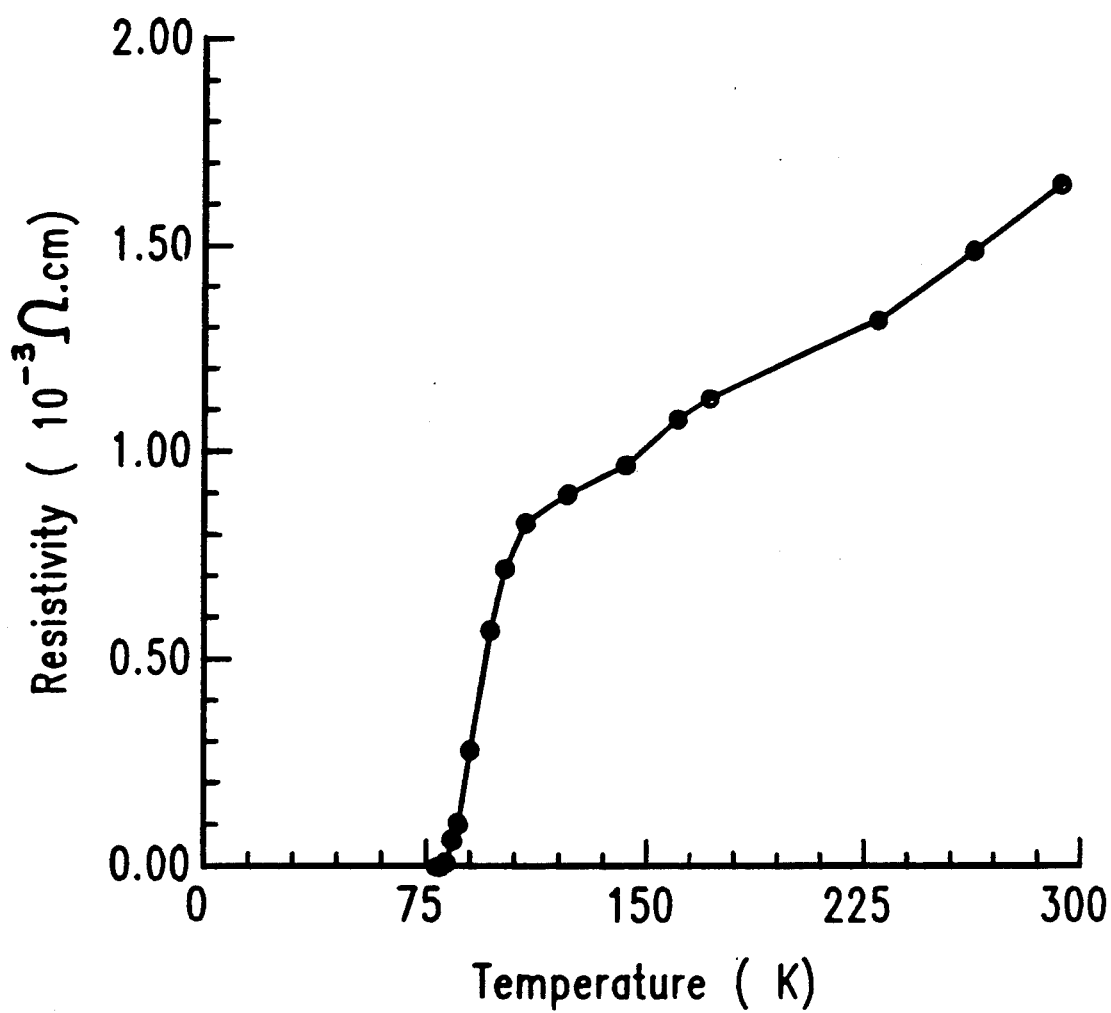
FIG. 16 Shows the dependence of the electrical resistivity on temperature for a laminate, containing 50.2 vol. % Sn and 31.0 vol. % fibers, that has been subjected to tension up to a stress of 90.6 MPa and a strain of 0.91%.

A laminate containing 31.0 vol. % fibers and 50.2 vol. % tin was subjected to tension up to a tensile stress of 90.6 Mpa and a tensile strain of 0.91% (below the stress or strain required for fracture) and then the load was released (allowing the strain to return to essentially zero) and the electrical resistivity was measured as a function of temperature, as shown in FIG. 16. It remained superconducting.

Figure 8:
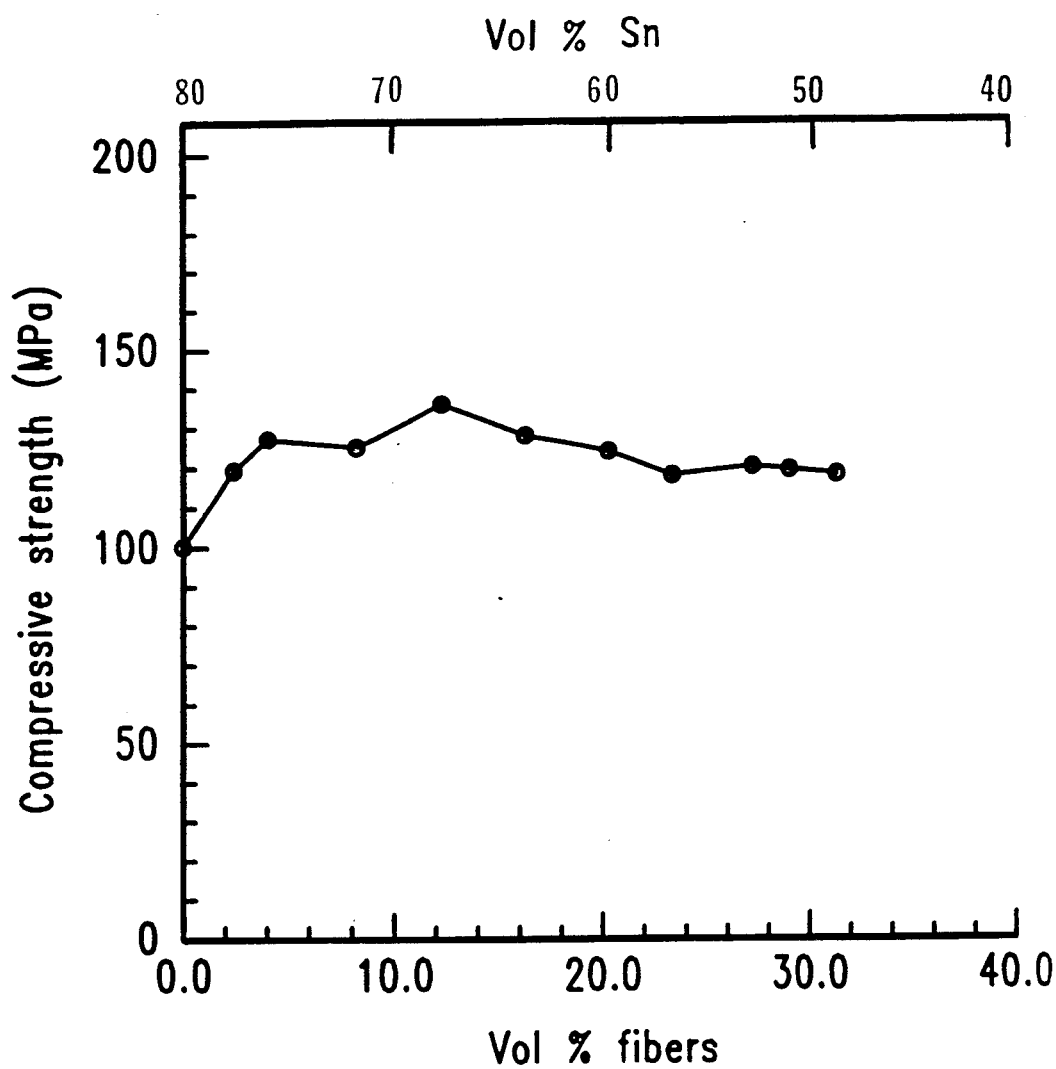
FIG. 8 Shows the effects of tin and fiber contents on the compressive strength; error bar of ±9%.

Comparison of FIG. 8 and 10 shows that, without fibers, the tensile strength (parallel to the fiber direction) was much less than the compressive strength (perpendicular to the fiber layers), but with about 24 vol. % fibers, the tensile strength was approximately equal to the compressive strength. With further increase of the fiber content, the tensile strength exceeded the compressive strength.

The tensile strength of the plain superconductor was roughly 5.2 MPa. The presence of tin (without fibers) increased the value to about 20 MPa (FIG. 10). Further addition of carbon fibers significantly increased the tensile strength, up to 134 MPa for 31 vol. % fibers.

Carbon fibers increased the compressive strength, compressive modulus, tensile strength and tensile modulus, but they decreased the compressive ductility and tensile ductility. However, because tin was also present and tin is a soft metal, the compressive ductility for the case of 31 vol. % fibers was approximately equal to that for the plain superconductor (without tin or fiber). For carbon fiber contents less than 30 vol. % fibers, the compressive ductility exceeded that of the plain superconductor. In general, the carbon fibers decreased the tensile ductility (FIG. 11) much less than the compressive ductility (FIG. 6).

FIG. 16 and 11 show that the superconducting behavior of the laminates was maintained after tension almost to the point of tensile fracture.

The fabrication of the laminates involved low temperatures. The simplicity of this process makes it possible for an operation to be set up for fabricating continuous superconducting cables which are both shielded and toughened by tin and strengthened by carbon fibers. In contrast to powder metallurgy, the diffusion bonding method allows the metal to be the major phase while still maintaining a continuous superconducting path in the laminate. Furthermore, carbon fibers, with their nearly zero thermal expansion coefficient helps match the thermal expansion coefficients of the MMC layer and the superconductor layer. This matching is necessary in order to enhance the durability of the composite to thermal cycling (i.e. thermal fatigue). In addition, carbon fibers are excellent in thermal conductivity (both at ambient and cryogenic temperatures), wear resistant, corrosion resistant, and are low in electrical resistivity.

Other embodiments of the invention will be apparent to the skilled in the art from a consideration of this specification or practice of the invention disclosed herein. It should be understood that there may be other embodiments which fall within the spirit and scope of the invention as defined by the following claims.

What is claimed is:

1. A superconducting laminate comprising first and second layers; said first layer comprising a high $T_c$ ceramic superconductor and said second layer comprising a metal; said first layer being diffusion bonded to said second layer, wherein said metal is selected from the group consisting of tin, indium and tin lead alloy.

2. The laminate as recited in claim 1 further comprising a third layer, said third layer being adjacent to and being diffusion bonded to a second side of said superconducting layer such that the first layer is adjacent to the first side of said superconducting layer.

3. A superconducting laminate comprising first and second layers; said first layer comprising a high $T_c$ ceramic superconductor and said second layer comprising a metal and carbon fiber; said first layer being diffusion bonded to said second layer, wherein said metal is selected from the group consisting of tin, indium and tin lead alloy.

4. The laminate as recited in claim 1 wherein the superconductor is selected from the group consisting of $YBa_2Cu_3O_{7-\delta}$, $Bi_2Sr_{3-x}Ca_xCu_2O_{8+y}$, and $Tl_2Ba_2CaCu_2O_8$.

5. The laminate as recited in claim 2 wherein the superconductor is selected from the group consisting of $YBa_2Cu_3O_{7-\delta}$, $Bi_2Sr_{3-x}Ca_xCu_2O_{8+y}$, and $Tl_2Ba_2CaCu_2O_8$.

6. The laminate as recited in claim 4 wherein the superconductor is $YBa_2Cu_3O_{7-\delta}$.

7. The laminate as recited in claim 5 wherein the superconductor is $YBa_2Cu_3O_{7-\delta}$.

8. The laminate as recited in claim wherein the metal is selected from the group consisting of tin, indium and tin lead alloy.

9. The laminate as recited in claim 8 wherein the metal is tin.

10. The laminate as recited in claim 2 wherein the metal is selected from the group consisting of tin, indium and tin lead alloy.

11. The laminate as recited in claim 6 wherein the metal is selected from the group consisting of tin, indium and tin lead alloy.

12. The laminate as recited in claim 7 wherein the metal is selected from the group consisting of tin, indium and tin lead alloy.

13. The laminate as recited in claim 10 wherein the second and third layers comprise the same metal.

14. The laminate as recited in claim 10 wherein the second and third layers comprise different metals.

15. The laminate as recited in claim 13 wherein the metal is tin.

16. The laminate as recited in claim 14 wherein the metals are tin and tin lead alloy.

17. The laminate as recited in claim 1 wherein the second layer further comprises carbon fibers.

18. The laminate as recited in claim 2 wherein the second layer further comprises carbon fibers.

19. The laminate as recited in claim 6 wherein the second layer further comprises carbon fibers.

20. The laminate as recited in claim 7 wherein the carbon fibers are from textile fiber precursors.

21. The laminate as recited in claim 17 wherein the carbon fibers are from textile fiber precursors.

22. The laminate as recited in claim 18 wherein the carbon fibers are from textile fiber precursors.

23. The laminate as recited in claim 19 wherein the carbon fibers are from textile fiber precursors.

24. The laminate as recited in claim 21 wherein the textile fibers are PAN based.

25. The laminate as recited in claim 22 wherein the textile fibers are PAN based.

26. The laminate as recited in claim 1 wherein the metal will be able to diffuse into the surface of the superconducting layer at a temperature lower than the degradation temperature of the superconductor.

27. The laminate as recited in claim 2 wherein the metal will be able to diffuse into the surface of the superconducting layer at a temperature lower than the degradation temperature of the superconductor.

28. The laminate as recited in claim 1 wherein the superconductor is a superconducting composite.

29. The laminate as recited in claim 2 wherein the superconductor is a superconducting composite.

30. The laminate as recited in claim 28 wherein the superconducting composite comprises a metal.

31. The laminate as recited in claim 29 wherein the superconducting composite comprises a metal.

32. The laminate as recited in claim 30 wherein said superconducting composite is fabricated by powder metallurgy.

33. The laminate as recited in claim 31 wherein said superconducting composite is fabricated by metal tube drawing.

34. The laminate as recited in claim 1 further comprising a plurality of alternating superconducting and metal containing layers.

35. The laminate as recited in claim 1 wherein the first layer comprises between about 20 to about 60 vol. % of the laminate.

36. The laminate as recited in claim 2 wherein the first layer comprises between about 20 to about 60 vol. % of the laminate.

37. The laminate as recited in claim 1 wherein the second layer comprises between about 40 to about 80 vol. % of the laminate.

38. The laminate as recited in claim 17 wherein the carbon fibers comprise between about 15–40 vol. % of said second layer.

39. The laminate as recited in claim 1 wherein the second layer is between about 0.1 mm to about 6 mm in thickness.

40. The laminate as recited in claim 35 wherein the second layer is between about 0.1 mm to about 6 mm in thickness.

41. The laminate as recited in claim 36 wherein the second layer is between about 0.1 mm to about 6 mm in thickness.

42. The laminate as recited in claim 38 wherein the second layer is between about 0.4 mm to about 6 mm in thickness.

43. The laminate as recited in claim 1 wherein the first layer is at least 1000 Angstroms in thickness.

44. The laminate as recited in claim 2 wherein the first layer is at least 1000 Angstroms in thickness.

45. The laminate as recited in claim 40 wherein the first layer is at least 1000 Angstroms in thickness.

46. The laminate as recited in claim 42 wherein the first layer is at least 1000 Angstroms in thickness.

47. A superconducting laminate comprising, first and second layers; said first layer comprising about 40 vol. % $YBa_2Cu_3O_{7-\delta}$, and being about 3.4 mm thick; said second layer comprising about 60 vol. % of tin and being about 2.3 mm thick; said first layer being diffusion bonded to said second layer at 140° C. and 5.3 MPa for about 15 minutes.

48. A superconducting laminate prepared by a process comprising the steps of:
 a) preparing a high $T_c$ superconducting layer;
 b) preparing a metal layer; and
 c) diffusion bonding said superconducting layer to said metal layer;

wherein said metal is selected from the group consisting essentially of tin, indium and tin lead alloy.

* * * * *